United States Patent
Hamada et al.

(10) Patent No.: US 12,550,519 B2
(45) Date of Patent: Feb. 10, 2026

(54) ORGANIC LIGHT-EMITTING DEVICE, DISPLAY DEVICE, ELECTRONIC APPARATUS, ONBOARD DISPLAY, AND VEHICLE

(71) Applicant: Shanghai Tianma Micro-Electronics Co., Ltd., Shanghai (CN)

(72) Inventors: Keita Hamada, Kanagawa (JP); Shigeru Mori, Kanagawa (JP)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 526 days.

(21) Appl. No.: 17/665,976

(22) Filed: Feb. 7, 2022

(65) Prior Publication Data

US 2022/0255031 A1 Aug. 11, 2022

(30) Foreign Application Priority Data

Feb. 8, 2021 (JP) ................. 2021-018159

(51) Int. Cl.
*H10K 50/11* (2023.01)
*H10K 101/00* (2023.01)
(Continued)

(52) U.S. Cl.
CPC ......... *H10K 50/11* (2023.02); *H10K 2101/30* (2023.02); *H10K 2101/40* (2023.02); *H10K 2101/90* (2023.02)

(58) Field of Classification Search
CPC .. C09K 11/06; H10K 85/654; H10K 85/6572; H10K 85/6576; H10K 85/6574; H10K 85/342
See application file for complete search history.

(56) References Cited

U.S. PATENT DOCUMENTS

2006/0251921 A1 11/2006 Forrest et al.
2008/0191618 A1 8/2008 Mishima
(Continued)

FOREIGN PATENT DOCUMENTS

JP 2008-535266 A 8/2008
JP 2008-227462 A 9/2008
(Continued)

OTHER PUBLICATIONS

Office Action issued Jun. 18, 2024 in Japanese Application No. 2021-018159.

*Primary Examiner* — Brian Turner
(74) *Attorney, Agent, or Firm* — Sughrue Mion, PLLC (57) ABSTRACT

An organic light-emitting device includes an anode electrode and a cathode electrode that are arranged facing each other; a light-emitting layer arranged between the anode electrode and the cathode electrode; and a hole transport layer arranged between the anode electrode and the light-emitting layer, contacting the light-emitting layer. The light-emitting layer includes a first host material and a second host material. An energy difference $\Delta E1$ between a HOMO energy level of the first host material and a HOMO energy level 13H of the hole transport layer 14aH is less than an energy difference $\Delta E2$ between a HOMO energy level 14bH of the second host material and the HOMO energy level 13H of the hole transport layer. The difference between the HOMO energy level 13H of the hole transport layer and the HOMO energy level 14aH of the first host material is 0.37 eV or less.

9 Claims, 9 Drawing Sheets (51) Int. Cl.
   *H10K 101/30*   (2023.01)
   *H10K 101/40*   (2023.01)

(56) References Cited

U.S. PATENT DOCUMENTS

| | | | |
|---|---|---|---|
| 2013/0075716 A1 | 3/2013 | Nishimura et al. | |
| 2014/0014940 A1 | 1/2014 | Pflumm et al. | |
| 2015/0255741 A1* | 9/2015 | Lee | H10K 50/11 257/40 |
| 2017/0012231 A1 | 1/2017 | Mishima et al. | |
| 2018/0151819 A1* | 5/2018 | Kim | H10K 50/11 |
| 2019/0157600 A1* | 5/2019 | Park | H10K 85/6574 |
| 2020/0203626 A1* | 6/2020 | Zhang | C09K 11/06 |
| 2021/0175457 A1* | 6/2021 | Park | H10K 59/38 |

FOREIGN PATENT DOCUMENTS

| | | |
|---|---|---|
| JP | 2013-201153 A | 10/2013 |
| JP | 2014-513418 A | 5/2014 |
| JP | 2017-022369 A | 1/2017 |

\* cited by examiner

FIG.9

ORGANIC LIGHT-EMITTING DEVICE, DISPLAY DEVICE, ELECTRONIC APPARATUS, ONBOARD DISPLAY, AND VEHICLE

CROSS-REFERENCE TO RELATED APPLICATION

This application claims the benefit of Japanese Patent Application No. 2021-18159, filed on Feb. 8, 2021, the entire disclosure of which is incorporated by reference herein.

FIELD

The present disclosure relates generally to an organic light-emitting device, a display device, an electronic apparatus, an onboard display, and a vehicle.

BACKGROUND

Organic light-emitting devices called organic electroluminescence (EL) devices are used in displays and the like. Organic EL devices include a light-emitting layer including an organic light-emitting material, and an anode electrode and a cathode electrode that sandwich the light-emitting layer. Additionally, in order to improve the luminous efficiency of the organic EL device, a hole transport layer or a hole injection layer is provided between the anode electrode and the light-emitting layer, and an electron transport layer or an electron injection layer is provided between the cathode electrode and the light-emitting layer (for example, see Unexamined Japanese Patent Application Publication (Translation of PCT Application) No. 2008-535266, Unexamined Japanese Patent Application Publication (Translation of PCT Application) No. 2014-513418, and Unexamined Japanese Patent Application Publication No. 2017-022369).

It is known that the lifetime of organic EL devices shortens in high temperature environments. It is preferable that organic EL devices that are exposed to various environments (for example, organic EL devices mounted in vehicles) have a longer lifetime in high temperature environments.

SUMMARY

An organic light-emitting device according to a first aspect of the present disclosure includes:
an anode electrode and a cathode electrode that are arranged facing each other;
a light-emitting layer arranged between the anode electrode and the cathode electrode; and
a hole transport layer arranged between the anode electrode and the light-emitting layer, contacting the light-emitting layer;
wherein
the light-emitting layer includes a first host material and a second host material,
a difference between a HOMO energy level of the hole transport layer and a HOMO energy level of the first host material is less than a difference between the HOMO energy level of the hole transport layer and a HOMO energy level of the second host material, and
the difference between the HOMO energy level of the hole transport layer and the HOMO energy level of the first host material is 0.37 eV or less.

A display device according to a second aspect of the present disclosure includes the organic light-emitting device according to the first aspect.

An onboard display according to a third aspect of the present disclosure includes the display device according to the second aspect.

An electronic apparatus according to a fourth aspect of the present disclosure includes the display device according to the second aspect.

A vehicle according to a fifth aspect of the present disclosure includes the onboard display according to the third aspect.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which.

DETAILED DESCRIPTION

Hereinafter, an organic light-emitting device 10, a display device 20, an electronic apparatus, an onboard display 30, and a vehicle according to embodiments are described while referencing the drawings.

Embodiment 1

Figure 1:
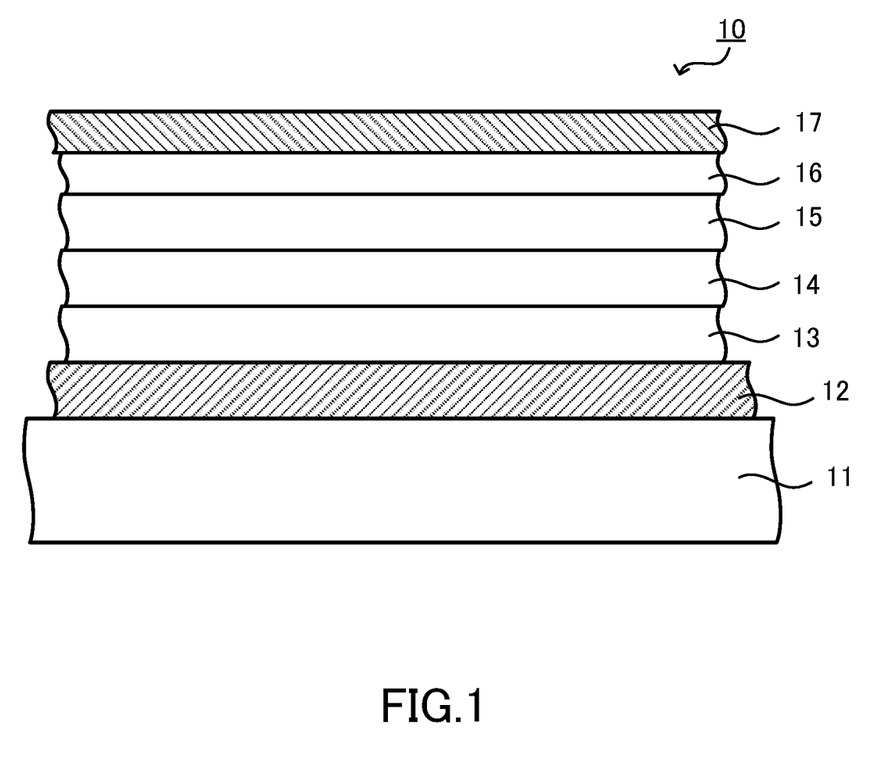
FIG. 1 is a cross-sectional view illustrating the structure of an organic light-emitting device according to Embodiment 1.

As illustrated in FIG. 1, the organic light-emitting device 10 includes an anode electrode 12 arranged on a substrate 11, a hole transport layer 13 arranged on the anode electrode 12, a light-emitting layer 14 arranged on the hole transport layer 13, an electron transport layer 15 arranged on the light-emitting layer 14, an electron injection layer 16 arranged on the electron transport layer 15, and a cathode electrode 17 arranged on the electron injection layer 16. The organic light-emitting device 10 may be used as a monochromatic light-emitting device. Additionally, the organic light-emitting device 10 can be used as a display device provided with pixels of different chromaticity such as red, green, and blue and used, for example, in a mobile product such as a smartphone or tablet, an onboard display, or the like.

The substrate 11 is an insulating substrate and, in one example, is implemented as a glass substrate. As illustrated in FIG. 1, the anode electrode 12, the hole transport layer 13, the light-emitting layer 14, and the like are stacked on the substrate 11. Any substrate such as, for example, a flexible substrate made from polyimide, polycarbonate, or the like, can be used as the substrate 11.

The anode electrode 12 is arranged on the substrate 11 and, as illustrated in FIG. 1, faces the cathode electrode 17 via the hole transport layer 13, the light-emitting layer 14, the electron transport layer 15, and the electron injection layer 16. The anode electrode 12 is connected to a non-illustrated power supply, and supplies holes to the hole transport layer 13. A material that is translucent and electrically conductive is used as the material that forms the anode electrode 12. Examples of materials that can be used include indium tin oxide (ITO), tin oxide ($SnO_2$), indium zinc oxide (IZO), and the like. Note that, when the organic light-emitting device 10 has a top emission structure, light is reflected on the substrate 11 side and light is emitted from the cathode electrode 17 side. In this case, an electrode obtained by arranging ITO or IZO on the surface of a reflective metal such as silver (Ag) or the like can be used as the anode electrode 12.

The hole transport layer 13 is disposed between the anode electrode 12 and the light-emitting layer 14, contacting the light-emitting layer 14. The hole transport layer 13 efficiently transports, to the light-emitting layer 14, the holes injected from the anode electrode 12. In general, a band gap of the hole transport layer 13 is larger than a band gap of the light-emitting layer 14. Note that, the term "band gap" refers to the energy difference between the energy level of the lowest unoccupied molecular orbital (LUMO) and the energy level of the highest occupied molecular orbital (HOMO). The HOMO energy levels can be measured using generally known atmospheric photoelectron yield spectroscopy. The band gap of each layer can be measured using generally known ultraviolet-visible near-infrared spectroscopy, and the LUMO energy level of each layer can be calculated from the measured HOMO energy level and band gap of each layer.

In the present embodiment, a known material can be used as the material for forming the hole transport layer 13. For example, the hole transport layer 13 can be formed using α-NPD (name: 2,2'-Dimethyl-N, N'-di-[(1-naphthyl)-N, N'-diphenyl]-1,1'-biphenyl-4,4'-diamine), TAPC (name: 4,4'-Cyclohexylidenebis [N, N-bis (4-methylphenyl) benzenamine]), TPD (name: N, N'-Bis (3-methylphenyl)-N, N'-diphenylbenzidine), and the like. The hole transport layer 13 is not limited being a single layer and may include a plurality of layers.

The light-emitting layer 14 is arranged between the anode electrode 12 and the cathode electrode 17. In the light-emitting layer 14, the holes injected from the anode electrode 12 and the electrons injected from the cathode electrode 17 efficiently recombine, and the light-emitting layer 14 emits light as a result of this recombination. The light-emitting layer 14 includes two types of host materials, namely a first host material and a second host material, and a light-emitting material.

A known material such as a fluorescent material, a thermally activated delayed fluorescent material, a phosphorescent material, or the like can be used as the light-emitting material. Examples of the light-emitting material include bistylylbenzene derivative, $Alq_3$ (name: Tris-(8-hydroxyquinoline) aluminum), rubrene, dimethylkinaccrydone, FIrpic (name: Bis[2-(4,6-difluorophenyl) pyridinato-C2, N] (picolinato) iridium (III)), Ir(ppy)3 (name: Tris[2-phenylpyridinato-C2, N] iridium (III)), (Ppy)2Ir(acac) (name: Bis[2-(2-pyridinyl-N) phenyl-C] (2,4-pentanedionato-O2, O4) iridium (III)), and the like.

A known host material with hole transportability or electron transportability can be used as the first host material. This applies to the second host material as well.

The host material with hole transportability is selected from pyrrole, indole, carbazole, azaindole, azacarbazole, triazole, oxazole, oxadiazole, pyrazole, imidazole, thiophene, polyarylalkane, pyrazoline, phenylenediamine, arylamine, amino-substituted chalcone, styrylanthracene, fluolenone, hydrazone, stilben, silazane, aromatic tertiary amine compounds, styrylamine compounds, aromatic dimethyridin compounds, porphyrin compounds, polysilane compounds, poly (N-vinylcarbazole), aniline copolymers, thiophene oligomers, polythiophene and other conductive polymer oligomers, organic silanes, carbon films, or derivatives thereof.

The host material with electron transportability is selected from pyridine, pyrimidine, triazine, imidazole, pyrazole, triazole, oxazole, oxadiazole, fluorenone, anthracinodimethane, antron, diphenylquinone, thiopyrandioxide, carbodiimide, fluorenylidenemethane, distyrylpyrazine, fluorine-substituted aromatic compounds, heterocyclic tetracarboxylic dianhydrides such as naphthalene perylene, phthalocyanine or a derivative thereof (may form fused rings with other rings), and various metal complexes typified by metal complexes of an 8-quinolinol derivative, a metal phthalocyanine, and a metal complex using benzoxazole or benzothiazole as a ligand.

Both the first host material and the second host material may be selected from the host material with hole transportability, or both may be selected from the host material with electron transportability. Additionally, one of the first host material and the second host material may be selected from the host material with hole transportability and the other may be selected from the material with electron transportability. In one example, the first host material is selected from the material with hole transportability, and the second host material is selected from the material with electron transportability. In the light-emitting layer 14, when the total weight of the first host material and the second host material is 100, a weight ratio of the first host material to the second host material (a weight of the first host material:a weight of the second host material) is from 10:90 to 90:10. In other words, in the light-emitting layer 14, the content of the first host material is from 10 wt % to 90 wt % of the total weight of the first host material and the second host material.

The electron transport layer 15 efficiently transports, to the light-emitting layer 14, the electrons injected from the electron injection layer 16. In the present embodiment, a known material can be used as the material for forming the electron transport layer 15. For example, the electron transport layer 15 can be formed using $Alq_3$, BCP (name: 3-Benzidino-6-(4-chlorophenyl) pyridazine), siror derivative, or the like. The electron transport layer 15 is not limited to being a single layer and may include a plurality of layers.

The electron injection layer 16 efficiently injects, into the electron transport layer 15, the electrons injected from the cathode electrode 17. Examples of materials that can be used to form the electron injection layer 16 include lithium fluoride (LiF), ytterbium (Yb), Liq (name: 8-Hydroxyquinolinolato-lithium), and the like.

The cathode electrode 17 is connected to a non-illustrated power supply, and supplies electrons to the electron injection layer 16. Examples of materials that can be used to form the cathode electrode 17 include aluminum, magnesium/silver alloy, ITO, IZO, and the like.

Figure 2:
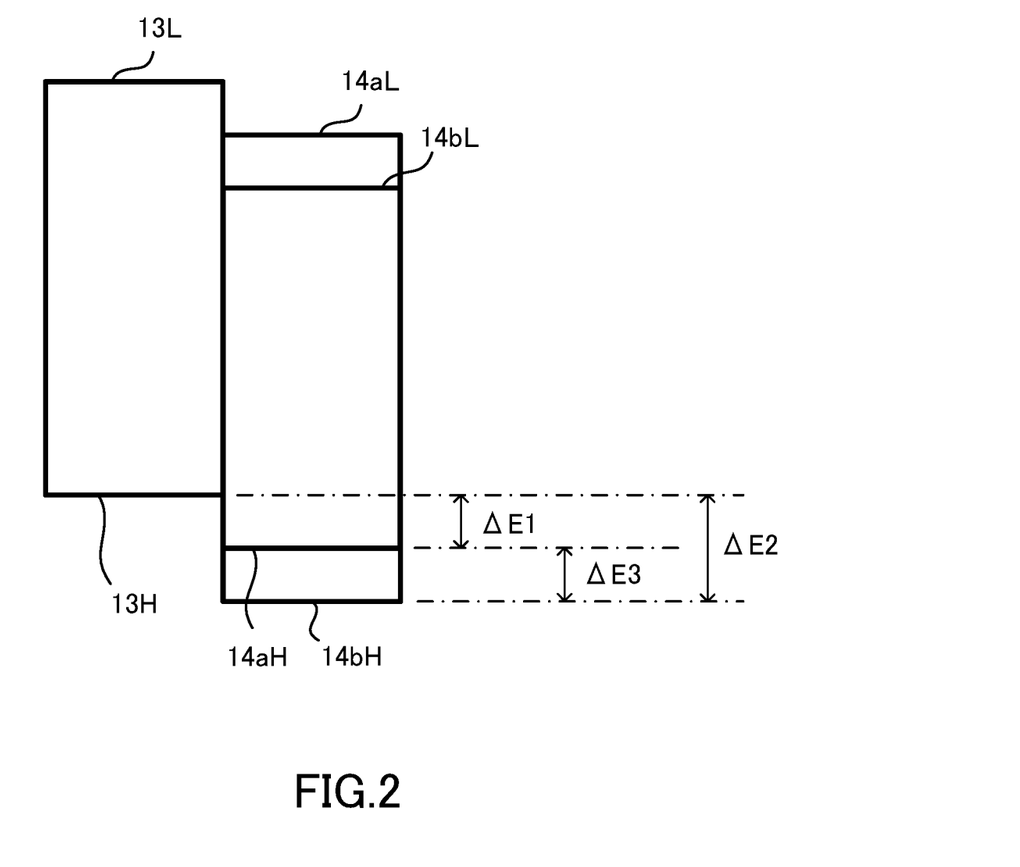
FIG. 2 is an energy state diagram of the hole transport layer, and the first host material and the second host material of a light-emitting layer of the organic light-emitting device according to Embodiment 1.

Next, the energy states of the hole transport layer 13, and the first host material and the second host material of the light-emitting layer 14 are illustrated in FIG. 2. In FIG. 2, reference numeral 13H represents the HOMO energy level of the hole transport layer 13, and reference numeral 13L represents the LUMO energy level of the hole transport layer 13. Reference numeral 14aH represents the HOMO energy level of the first host material of the light-emitting layer 14, and reference numeral 14aL represents the LUMO energy level of the first host material of the light-emitting layer 14. Reference numeral 14bH represents the HOMO energy level of the second host material of the light-emitting layer 14, and reference numeral 14bL represents the LUMO energy level of the second host material of the light-emitting layer 14.

In the present embodiment, the energy states of the hole transport layer 13 and the first host material and the second host material of the light-emitting layer 14 have the following two particularly prominent characteristics.

Firstly, the difference between the HOMO energy level 13H of the hole transport layer 13 and the HOMO energy level 14aH of the first host material of the light-emitting layer 14 is 0.37 eV or less. Note that the HOMO energy level 13H of the hole transport layer 13 that contacts the light-emitting layer 14 is higher than the HOMO energy level 14aH of the first host material of the light-emitting layer 14. Referencing FIG. 2, $\Delta E1$ is an energy difference obtained by subtracting the HOMO energy level 14aH of the first host material of the light-emitting layer 14 from the HOMO energy level 13H of the hole transport layer 13, and $\Delta E1$ is in range of greater than 0 eV and 0.37 eV or less (0 eV<$\Delta E1 \leq 0.37$ eV). The energy difference $\Delta E1$ is preferably in a range of greater than 0 eV and 0.34 eV or less (0 eV<$\Delta E1 \leq 0.34$ eV), and is more preferably in a range of greater than 0 eV and 0.32 eV or less (0 eV<$\Delta E1 \leq 0.32$ eV).

Secondly, the absolute value of the difference between the HOMO energy level of the first host material and the HOMO energy level of the second host material is 0.3 eV or less. The difference between the HOMO energy level of the first host material and the HOMO energy level of the hole transport layer 13 is less than the difference between the HOMO energy level of the second host material and the HOMO energy level of the hole transport layer 13. In other words, the HOMO energy level of the first host material is closer than the HOMO energy level of the second host material to the HOMO energy level of the hole transport layer 13. Referencing FIG. 2, $\Delta E1$ is the energy difference obtained by subtracting the HOMO energy level 14aH of the first host material of the light-emitting layer 14 from the HOMO energy level 13H of the hole transport layer 13, and $\Delta E2$ is an energy difference obtained by subtracting the HOMO energy level 14bH of the second host material of the light-emitting layer 14 from the HOMO energy level 13H of the hole transport layer 13. In this case, $\Delta E1$ is less than $\Delta E2$ ($\Delta E1<\Delta E2$). $\Delta E3$ is an energy difference obtained by subtracting the HOMO energy level 14bH of the second host material from the HOMO energy level 14aH of the first host material. In this case, $\Delta E3$ is 0.3 eV or less ($\Delta E3 \leq 0.3$ eV).

Next, a description of the advantageous effects exhibited as a result of having there prominent characteristics is given while referencing high-temperature lifetime characteristics of the organic light-emitting device 10.

Figure 3:
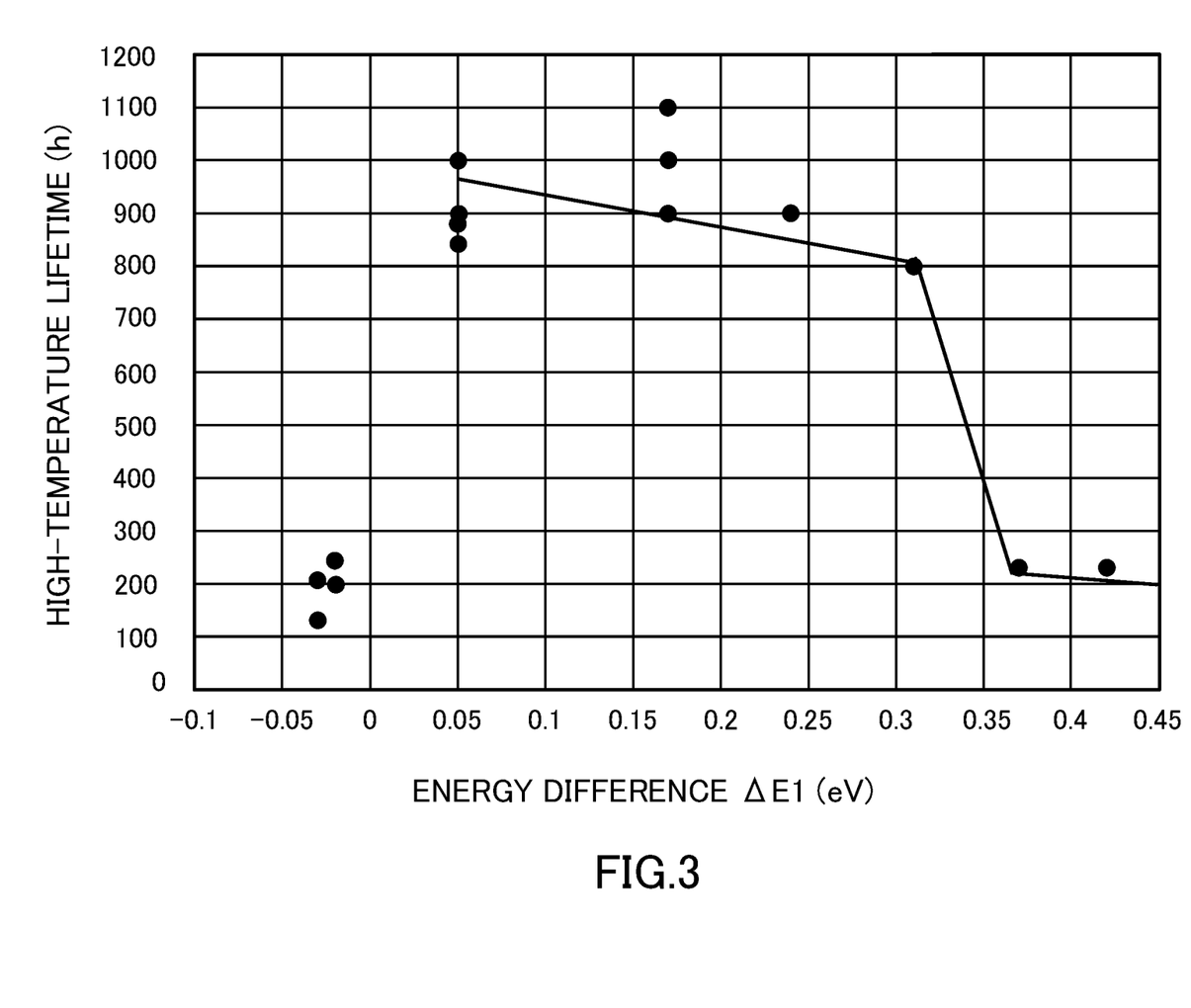
FIG. 3 is a graph illustrating the relationship between an energy difference $\Delta E1$ obtained by subtracting a HOMO energy level of the light-emitting layer from a HOMO energy level of the hole transport layer, and lifetime in high temperature environments (high-temperature lifetime)

Firstly, a graph illustrating the relationship between the energy difference $\Delta E1$ [eV] (horizontal axis) and high-temperature lifetime [h] (vertical axis) is illustrated in FIG. 3. Note, in the present disclosure, the term "high-temperature lifetime" refers to an amount of time (hours) it takes for the intensity of the light emitted by the organic light-emitting device 10 to decrease 20% compared to an initial intensity, when the organic light-emitting device 10 is driven continuously at a current density of 10 mA/cm$^2$ in an 85° C. environment. The HOMO energy levels can be measured using atmospheric photoelectron yield spectroscopy. Note that, in FIG. 3, the energy difference ($\Delta E3$), obtained by subtracting the HOMO energy level of the second host material from the HOMO energy level of the first host material, between the first host material and the second host material is 0.3 eV or less.

As illustrated in FIG. 3, in the range where the energy difference $\Delta E1$ is greater than 0.37 eV, the high-temperature lifetime is about 200 hours, but in the range where the energy difference $\Delta E1$ is from 0.37 eV to 0.32 eV, the high-temperature lifetime increases as the energy difference $\Delta E1$ decreases. When the energy difference $\Delta E1$ is 0.34 eV or less, the high-temperature lifetime exceeds 500 hours. When the energy difference $\Delta E1$ is 0.32 eV or less, the high-temperature lifetime exceeds 800 hours. In addition, as illustrated in FIG. 3, when the energy difference $\Delta E1$ is less than 0 eV, that is, when the HOMO energy level 13H of the hole transport layer 13 contacting the light-emitting layer 14 is less than the HOMO energy level 14aH of the first host material of the light-emitting layer 14, the high-temperature lifetime decreases to about 200 hours. This is predicted to be because, when $\Delta E1$ is 0 eV or less, it is difficult for the holes flowing through the hole transport layer 13 to overcome the barrier of the light-emitting layer 14. As such, it is preferable that the energy difference $\Delta E1$ is greater than 0 eV.

Accordingly, the high-temperature lifetime can be lengthened even more by setting the energy difference $\Delta E1$ to greater than 0 eV and 0.37 eV or less (0 eV<$\Delta E1 \leq 0.37$ eV). It is preferable that the energy difference $\Delta E1$ be set to 0 eV<$\Delta E1 \leq 0.34$ eV because the high-temperature lifetime will exceed 500 hours. It is particularly preferable that the energy difference $\Delta E1$ be set to 0 eV<$\Delta E1 \leq 0.32$ eV because the high-temperature lifetime can be lengthened even more.

Figure 4:
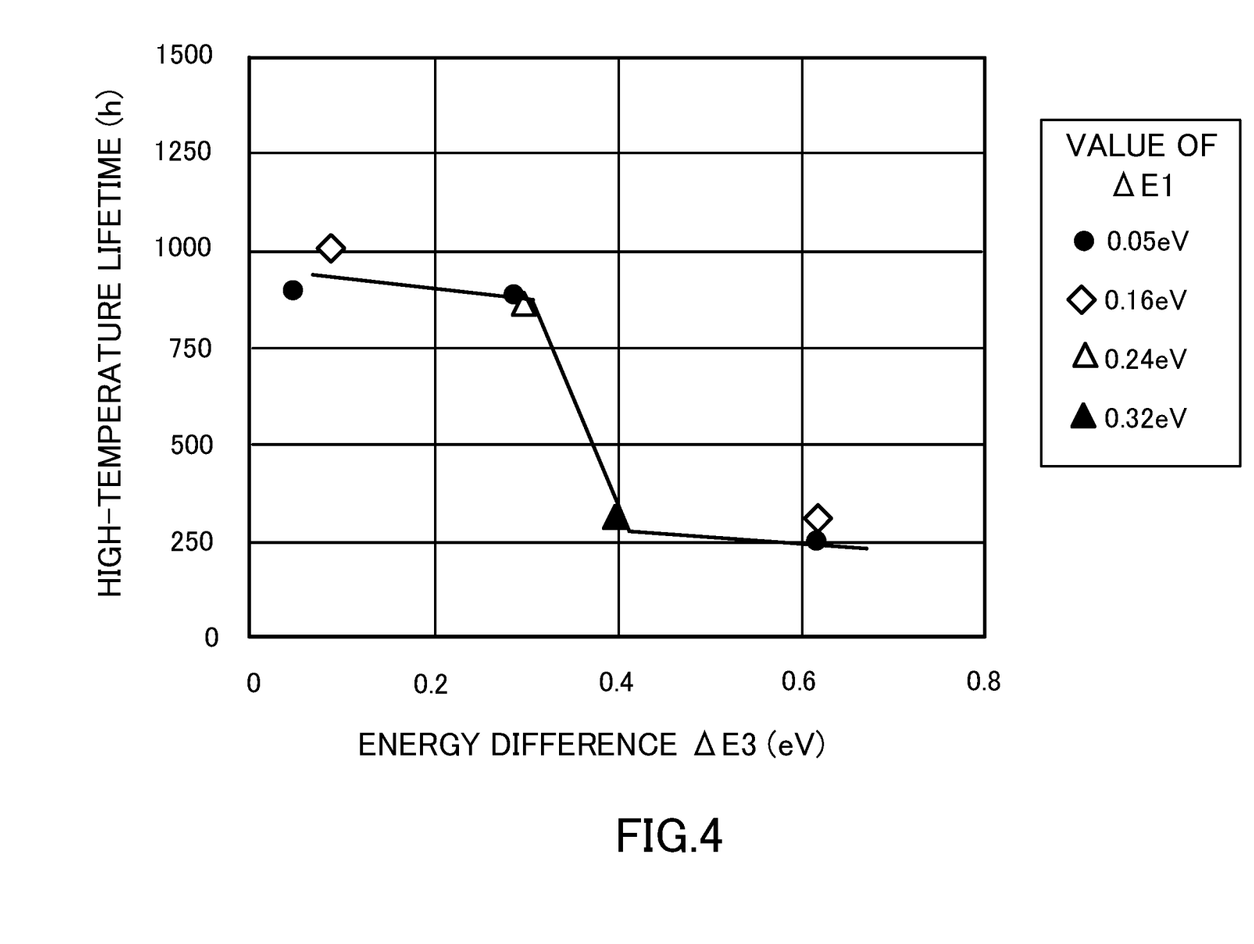
FIG. 4 is a graph illustrating the relationship between an energy difference $\Delta E3$ between a HOMO energy level of the first host material and a HOMO energy level of the second host material of the light-emitting layer, and lifetime in high temperature environments (high-temperature lifetime)

Next, a graph illustrating the relationship between the energy difference $\Delta E3$ [eV] (horizontal axis) obtained by subtracting the HOMO energy level 14bH of the second host material from the HOMO energy level 14aH of the first host material, and the high-temperature lifetime [h] (vertical axis) is illustrated in FIG. 4. The legend in FIG. 4 illustrates the value of $\Delta E1$ at each point. As illustrated in the legend, the energy differences $\Delta E1$ at each point all satisfy 0 eV<$\Delta E1 \leq 0.37$ eV.

As illustrated in FIG. 4, when the energy difference $\Delta E3$ is 0.3 eV or less, high-temperature lifetime exceeding 800 hours is obtained. However, when the energy difference $\Delta E3$ exceeds 0.3 eV, the high-temperature lifetime decreases as the energy difference $\Delta E3$ increases and, when the energy difference $\Delta E3$ is 0.4 eV, the high-temperature lifetime decreases to about 250 hours. When ΔE3 exceeds 0.3 eV, the high-temperature lifetime decreases, even when ΔE1 is 0.32 eV or less.

Thus, the high-temperature lifetime of the organic light-emitting device 10 can be lengthened even more by setting the energy difference ΔE1 to greater than 0 eV and 0.37 eV or less (0 eV<ΔE1≤0.37 eV) and, also, setting the energy difference ΔE3 to 0.3 eV or less.

With the organic light-emitting device 10 of the present embodiment, the high-temperature lifetime can be lengthened and, as such, the organic light-emitting device 10 can be advantageously used as an element having a short light-emission wavelength and, in particular, as a green element. This is because, although deeper blues and deeper greens are typically sought to widen the chromaticity range in response to the expansion of the uses of displays, the lifetime of elements that have short light-emission wavelengths also tends to be short.

The organic light-emitting device 10 can be produced by a manufacturing method such as described hereinafter.

Firstly, the substrate 11 is prepared. Next, the anode electrode 12 made from ITO, for example, is formed by a sputtering method on a surface of the substrate 11. Next, the hole transport layer 13 is formed on the anode electrode 12 by a vacuum deposition method, for example. Next the light-emitting layer 14 is formed on the hole transport layer 13 by a vacuum deposition method, for example. The hole transport layer 13 and the first host material and the second host material of the light-emitting layer 14 are selected so that the energy difference ΔE1 is in the range of greater than 0 eV and 0.37 eV or less. Additionally, the hole transport layer 13 and the first host material and the second host material of the light-emitting layer 14 are selected so that the energy difference ΔE3 is 0.3 eV or less. Moreover, the weight ratio of the first host material to the second host material is set to from 10:90 to 90:10.

Next, the electron transport layer 15, the electron injection layer 16, and the cathode electrode 17 are formed sequentially on the light-emitting layer 14 by a known method such as vacuum deposition or the like.

Note that the present disclosure can also be applied to an organic light-emitting device that includes pixels for each light emitting element that has a different color such as red, green, and blue. In such a case, firstly, a transistor is formed on the substrate 11, and the anode electrode 12 is formed on that substrate 11 by a sputtering method. Thereafter, a pixel definition layer is formed using an organic film. Next, the hole transport layer 13 to the cathode electrode 17 are sequentially formed by a vacuum deposition method or the like on the anode electrode 12 within the opened region of the pixel definition layer. Thus, an organic light-emitting device including pixels using each of red, green, and blue light emitting elements can be produced.

Embodiment 2

Next, an organic light-emitting device 10 according to Embodiment 2 is described. Note that the organic light-emitting device 10 according to Embodiment 2 has the same structure (the structure illustrated in FIG. 1) as the organic light-emitting device 10 according to Embodiment 1 and, as such, detailed descriptions of features that are shared with Embodiment 1 are forgone.

With the organic light-emitting device 10 according to Embodiment 2, the light-emitting layer 14 includes a light-emitting material, and a first host material and a second host material as in Embodiment 1. In the light-emitting layer 14, when the total weight of the first host material and the second host material is 100, a weight ratio of the first host material to the second host material (a weight of the first host material:a weight of the second host material) is preferably from 20:80 to 75:25, and more preferably from 45:55 to 70:30. In other words, the content of the first host material is preferably from 20 wt % to 75% and more preferably from 45 wt % to 70 wt % of the total weight of the first host material and the second host material. Note that, as in Embodiment 1, the HOMO energy level of the hole transport layer, and the HOMO energy level of the first host material and the HOMO energy level of the second host material satisfy 0 eV<ΔE1≤0.37 eV and ΔE3≤0.3 eV.

Next, a description of the advantageous effects exhibited as a result of having these prominent characteristics is given while referencing the high-temperature lifetime characteristics of the organic light-emitting device 10.

Figure 5:
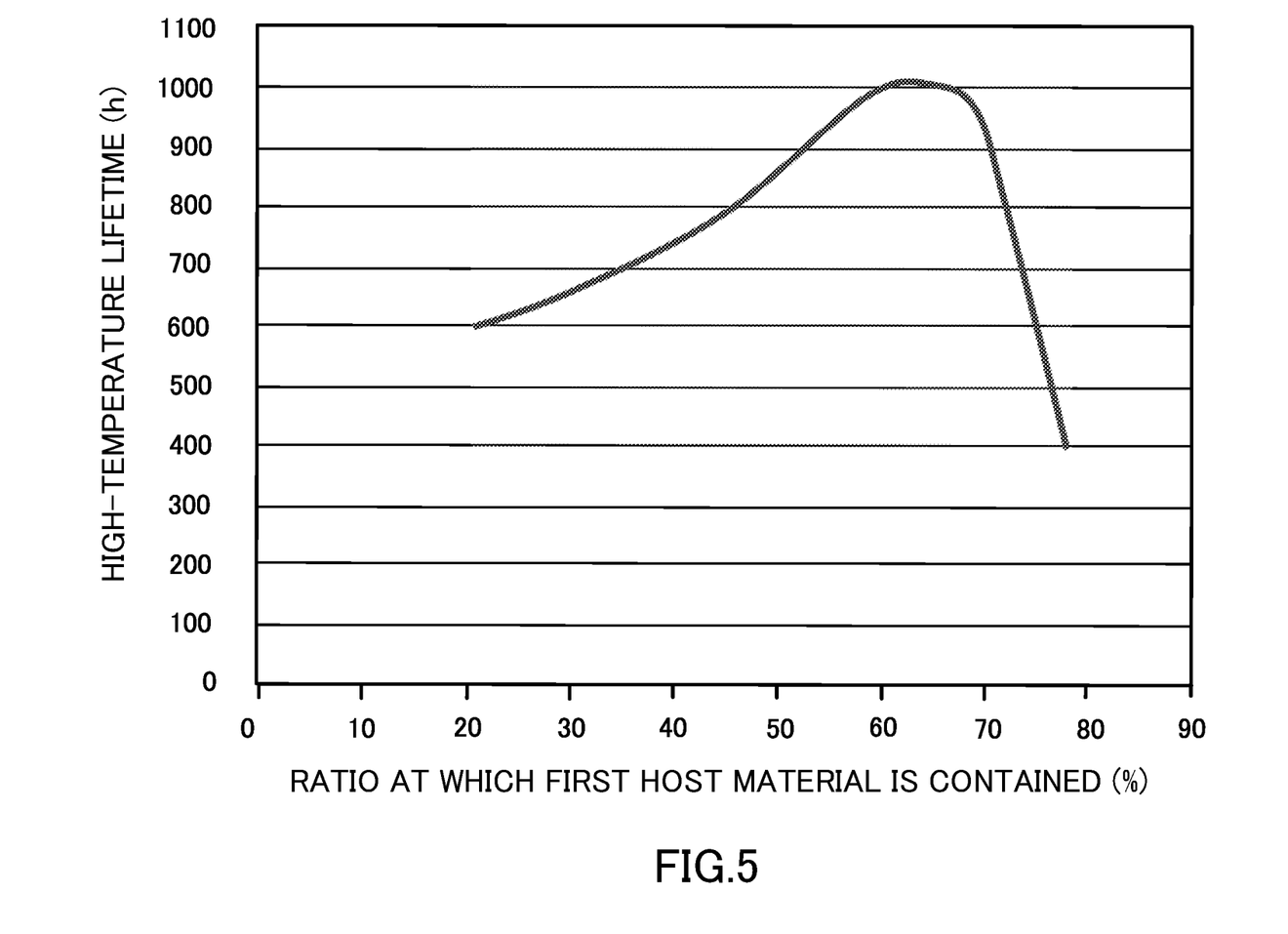
FIG. 5 is a graph illustrating the relationship between a ratio at which the first host material is contained and lifetime in high temperature environments (high-temperature lifetime)

A graph illustrating the relationship between the ratio at which the first host material is contained [%] (horizontal axis) and the high-temperature lifetime [h] (vertical axis) is illustrated in FIG. 5. The ratio at which the first host material is contained [%] is the weight (wt %) of the first host material with respect to the total weight of the first host material and the second host material of the light-emitting layer 14. As illustrated in FIG. 5, when the ratio at which the first host material is contained is from 20% to 75%, the high-temperature lifetime exceeds 500 hours. Furthermore, when the ratio at which the first host material is contained is from 45% to 70%, the high-temperature lifetime exceeds 800 hours.

Thus, the high-temperature lifetime of the organic light-emitting device 10 can be lengthened even more by setting the weight ratio of the first host material to the second host material (a weight of the first host material:a weight of the second host material) in the light-emitting layer 14 to from 20:80 to 75:25. Furthermore, the high-temperature lifetime can be further lengthened by setting the weight ratio of the first host material to the second host material to from 45:55 to 70:30.

Embodiment 3

Figure 6:
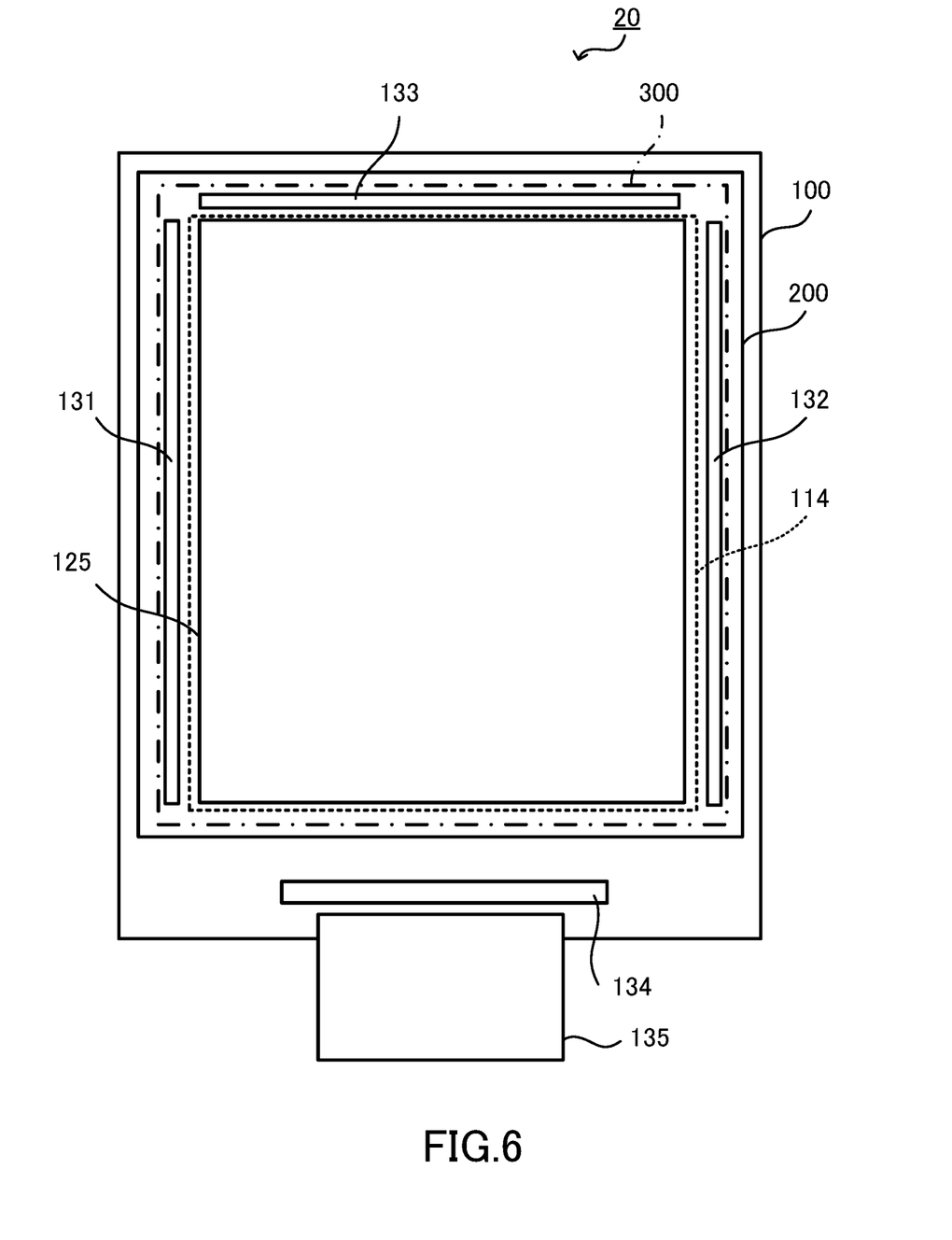
FIG. 6 is a drawing schematically illustrating a configuration example of a display device according to Embodiment 3.

Next, Embodiment 3 is described. The present embodiment relates to an OLED display device (display device) 20 that uses the organic light-emitting device 10 according to the various embodiments described above. FIG. 6 schematically illustrates a configuration example of the display device 20 according to the present embodiment.

The display device 20 includes a thin film transistor (TFT) substrate 100, a sealing substrate 200, and a bonder (glass frit bond) 300. The organic light-emitting device 10 as an OLED element is formed on the TFT substrate 100. The sealing substrate 200 is disposed opposite the TFT substrate 100. The bonder 300 is provided between the TFT substrate 100 and the sealing substrate 200, bonds the TFT substrate 100 and the sealing substrate 200 to each other, and seals the OLED element.

A scan driver 131, an emission driver 132, a protection circuit 133, and a driver integrated circuit (IC) 134 are arranged around a cathode electrode forming region 114 outside a display region 125 of the TFT substrate 100. These components are connected to an external device via a flexible printed circuit (FPC) 135.

The scan driver 131 drives scan lines of the TFT substrate 100. The emission driver 132 drives emission control lines to control a light emission period of each sub-pixel. In one example, the driver IC 134 is mounted using an anisotropic conductive film (ACF).

The driver IC 134 provides power supplies and timing signals (control signals) to the scan driver 131 and the emission driver 132, and also provides data voltage corresponding to video data to the data lines. That is, the driver IC 134 has a display control function.

The sealing substrate 200 is a transparent insulating substrate and, in one example, is implemented as a glass substrate. A 214 retardation plate and a polarizing plate are arranged on a light emission face (front face) of the sealing substrate 200, and suppress the reflection of light that enters from outside.

Figure 7:
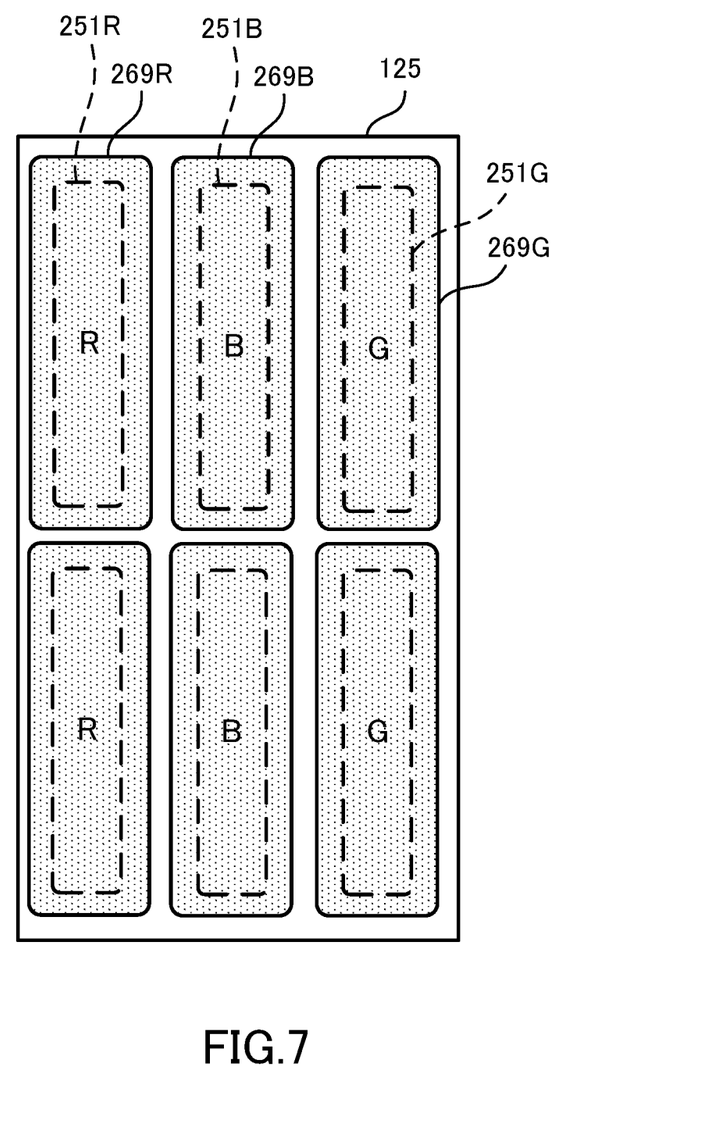
FIG. 7 is a plan view illustrating a portion of a display region of the display device.

A plurality of sub-pixels are arranged in the display region 125. FIG. 7 is a plan view illustrating a portion of the display region 125. FIG. 7 illustrates the plurality of sub-pixels arranged in a matrix. At least three of the sub-pixels are sub-pixels that emit light of a first color to a third color that differ from each other. Note that, in one example, the first color is blue, the second color is red, and the third color is green. FIG. 7 illustrates a red sub-pixel (light emission region) 251R, a blue sub-pixel (light emission region) 251B, and a green sub-pixel (light emission region) 251G. All regions of the various sub-pixels (the light emission regions) are covered by an organic light-emitting layer of the same color. Specifically, the red sub-pixels 251R, the blue sub-pixels 251B, and the green sub-pixels 251G are completely covered by a red organic light-emitting layer 269R, a blue organic light-emitting layer 269B, and a green organic light-emitting layer 269G, respectively. Of the sub-pixels illustrated in FIG. 7, only one of each of the red, blue, and green sub-pixels is marked with a reference numeral. Each of the sub-pixels displays red, blue, or green color. One pixel (main pixel) is composed of a red, blue, and green sub-pixel.

In the present embodiment, each of the sub-pixels is constituted by the organic light-emitting device 10 according to Embodiments 1 or 2. Accordingly, the high-temperature lifetime of the display device 20 can be lengthened due to the effects of the configuration described in Embodiment 1 or 2.

Embodiment 4

Figure 8:
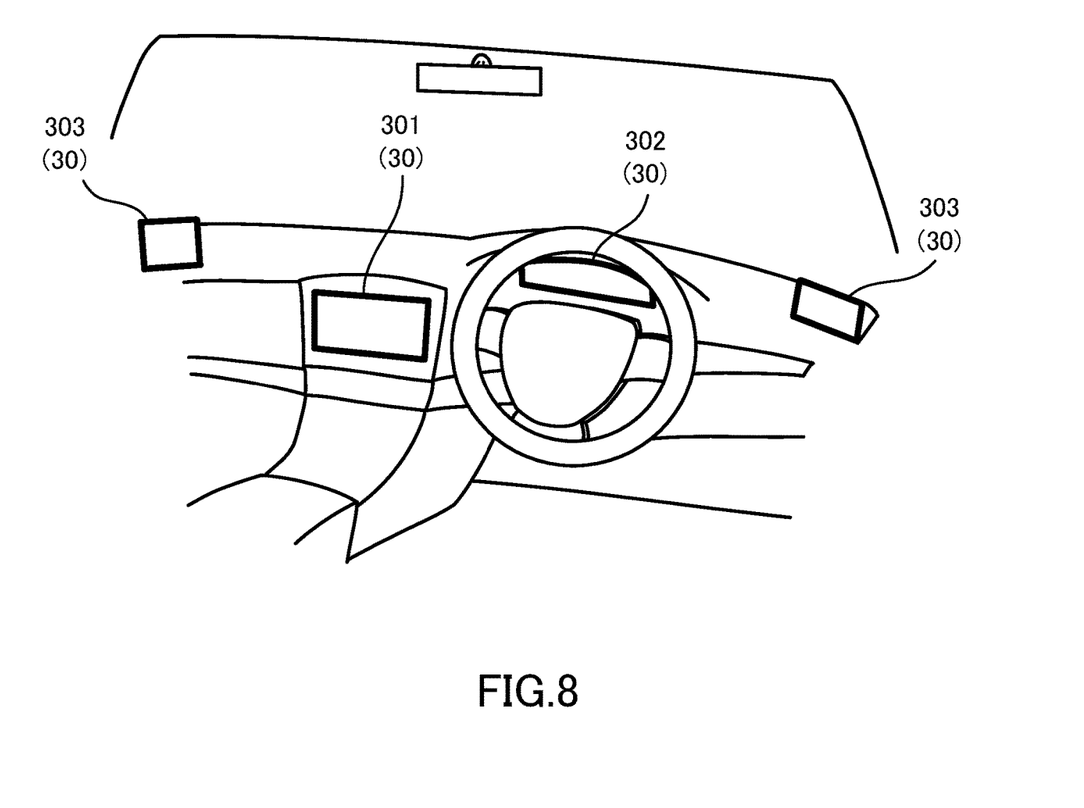
FIG. 8 is a drawing illustrating a configuration example of an onboard display according to Embodiment 4.

Next, Embodiment 4 is described. The present embodiment relates to an onboard display 30 that uses the display device 20 according to Embodiment 3. FIG. 8 is a drawing illustrating a configuration example of a vehicle provided with the onboard display, and the onboard display according to the present embodiment.

The onboard display 30 is a display that is provided inside an automobile 35, as the vehicle, illustrated in FIG. 8. The onboard display 30 displays various types of information. In one example, the onboard display 30 is implemented as a center information display (CID) 301, a cluster display 302, and side displays 303 illustrated in FIG. 8. In the present embodiment, the CID 301, the cluster display 302, and the side displays 303 are displays that use the display device 20.

The CID 301 is provided in the center of a dashboard of the automobile 35. The CID 301 displays information about audio and navigation systems and an automobile status management system. The cluster display 302 displays a speedometer and the like. The side displays 303 are provided on the left and right of the dashboard, and function as side mirrors by displaying camera images.

In some cases, the interior of the automobile 35 where these onboard displays 30 are provided becomes a high temperature environment due to the effects of sunlight and the like. The high-temperature lifetime of the onboard display 30 can be lengthened due to the use of the display device 20 that includes the organic light-emitting device 10. Accordingly, even onboard displays 30 that are exposed to high temperature environments can carry out excellent displaying for an extended period of time.

Embodiment 5

Figure 9:
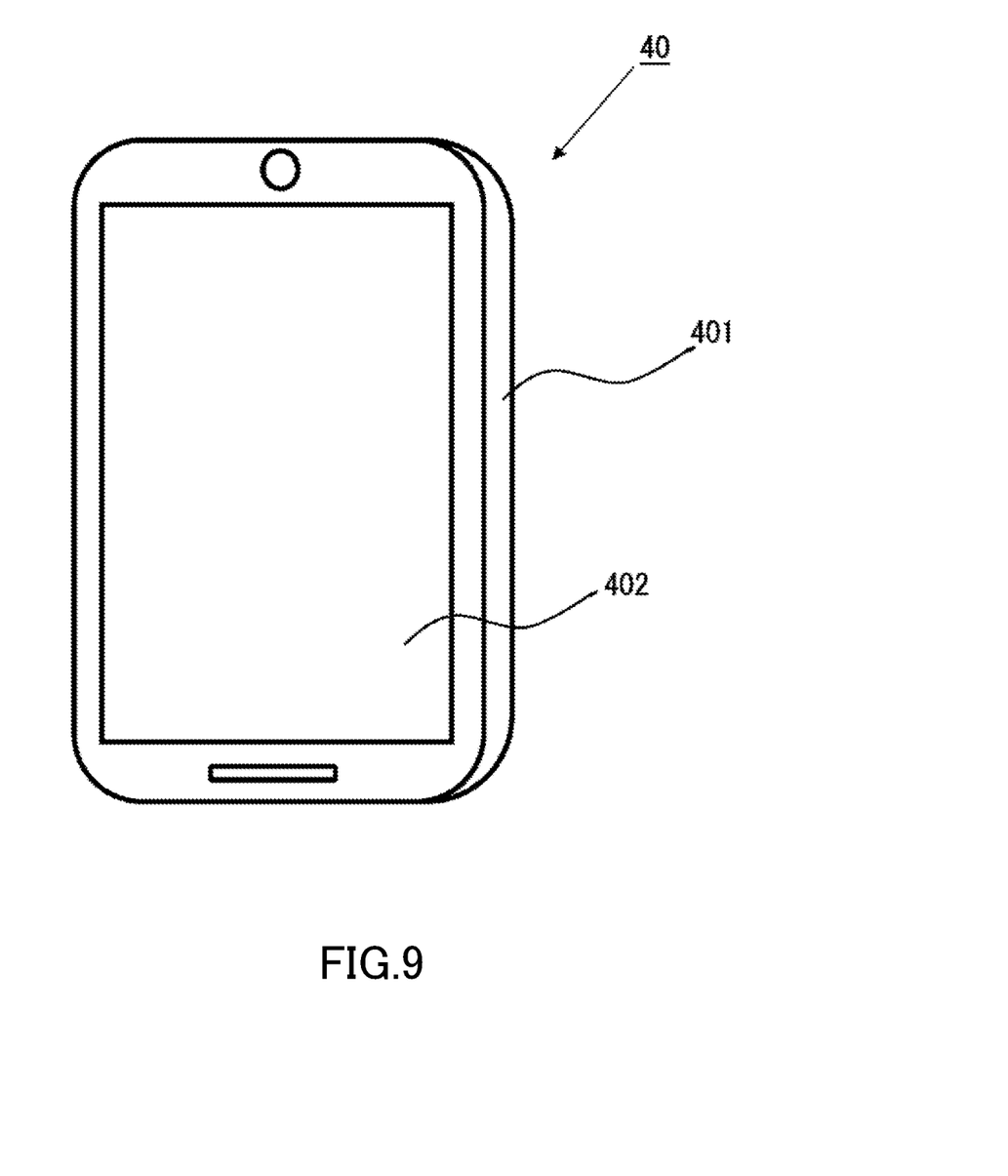
FIG. 9 is a drawing illustrating a configuration example of an electronic apparatus according to Embodiment 5.

Next, Embodiment 5 is described. The present embodiment relates to an electronic apparatus that uses the display device according to Embodiment 3. FIG. 9 is a perspective view of a smartphone 40 as the electronic apparatus. With the smartphone 40, the display device 20 according to Embodiment 3 is provided in a housing 401, and a cover glass 402 is provided on a display face side of the display device 20. Additionally, a sending/receiving device, various control devices, a storage device, an audio device including a speaker and a microphone, a battery, and other devices that have functions required for a smartphone are provided in the housing.

In some cases, the smartphone 40 may be used in high temperature environments. For example, the smartphone 40 may be used outdoors. The smartphone 40 uses the display device 20. As a result, the high-temperature lifetime of the smartphone 40 can be lengthened. Accordingly, even smartphones 40 that are exposed to high temperature environments can carry out excellent displaying for an extended period of time.

Embodiments according to the present disclosure are described above, but the present disclosure is not limited to these embodiments. It would be obvious to a person skilled in the art various changes, modifications, combinations, and the like are possible.

The materials used in the various layers of the organic light-emitting device 10 are not limited to the materials described above in the embodiments. Provided that the relationships of 0 eV<$\Delta E1 \leq 0.37$ eV and $\Delta E3 \leq 0.3$ eV are satisfied, the materials used as the hole transport layer 13, the first host material, and the second host material can be appropriately selected. As described above, the HOMO energy levels of the hole transport layer 13, the first host material, and the second host material can be measured using atmospheric photoelectron yield spectroscopy or the like. Using such measurement methods makes it possible to select a suitable material to be used for each layer.

The anode electrode 12, the electron transport layer 15, the electron injection layer 16, and the cathode electrode 17 are not limited to single-layer structures, and may have stacked structures. Additionally, the materials used as the anode electrode 12, the electron transport layer 15, the electron injection layer 16, and the cathode electrode 17 are not limited to the materials described above, and any material can be selected. Note that a configuration is possible in which the electron injection layer 16 is not formed.

In Embodiment 4, an example is given in which the CID 301, the cluster display 302, and the side displays 303 are implemented as the onboard display 30, but the present disclosure is not limited thereto. The onboard display 30 can be implemented as any display to be provided in a vehicle.

In Embodiment 5, an example is given in which the electronic apparatus is implemented as a smartphone, but the present disclosure is not limited thereto and the electronic apparatus may be implemented as a personal computer, a personal digital assistant (PDA), a tablet terminal, a head-mounted display, a projector, a digital (video) camera, or the like, for example.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. An organic green light-emitting device comprising:
    an anode electrode and a cathode electrode that are arranged facing each other;
    a light emitting layer arranged between the anode electrode and the cathode electrode; and
    a hole transport layer arranged between the anode electrode and the light-emitting layer, contacting the light-emitting layer,
    wherein
    the light-emitting layer includes a first host material, a second host material, and one type of green light-emitting material,
    a difference between a HOMO energy level of the hole transport layer and a HOMO energy level of the first host material is less than a difference between the HOMO energy level of the hole transport layer and a HOMO energy level of the second host material,
    the difference between the HOMO energy level of the hole transport layer and the HOMO energy level of the first host material is more than 0 eV and 0.37 eV or less, and
    in the light-emitting layer, a difference between the HOMO energy level of the first host material and the HOMO energy level of the second host material is 0.3 eV or less.

2. The organic light-emitting device according to claim 1, wherein the difference between the HOMO energy level of the hole transport layer and the HOMO energy level of the first host material is 0.34 eV or less.

3. The organic light-emitting device according to claim 1, wherein a weight ratio of the first host material to the second host material is from 20:80 to 75:25.

4. The organic light-emitting device according to claim 1, wherein a weight ratio of the first host material to the second host material is from 45:55 to 70:30.

5. A display device comprising:
    the organic light-emitting device according to claim 1.

6. An onboard display comprising:
    the display device according to claim 5.

7. A vehicle comprising:
    the onboard display according to claim 6.

8. The organic light-emitting device according to claim 1, wherein the first host material and the second host material both have hole transportability, or both have electron transportability.

9. The organic light-emitting device according to claim 1, wherein the light-emitting layer includes the first host material, the second host material, and only the one type of green light-emitting material.

* * * * *